US008803577B2

(12) United States Patent
Park et al.

(10) Patent No.: US 8,803,577 B2
(45) Date of Patent: Aug. 12, 2014

(54) DELAY LOCKED LOOP WITH A LOOP-EMBEDDED DUTY CYCLE CORRECTOR

(71) Applicants: SK hynix Inc., Icheon-si (KR); Postech Academy-Industry Foundation, Pohang-si (KR)

(72) Inventors: Hong June Park, Pohang-si (KR); Ji Hun Lim, Pohang-si (KR)

(73) Assignees: SK Hynix Inc., Icheon (KR); Postech Academy-Industry Foundation, Pohang (KR)

( * ) Notice: Subject to any disclaimer, the term of this patent is extended or adjusted under 35 U.S.C. 154(b) by 0 days.

(21) Appl. No.: 13/850,256

(22) Filed: Mar. 25, 2013

(65) Prior Publication Data

US 2014/0002155 A1  Jan. 2, 2014

(30) Foreign Application Priority Data

Jun. 29, 2012  (KR) .......................... 10-2012-0071347

(51) Int. Cl.
*H03L 7/06* (2006.01)
*H03L 7/08* (2006.01)

(52) U.S. Cl.
CPC .................................... *H03L 7/0802* (2013.01)
USPC .......................................... 327/158; 327/149

(58) Field of Classification Search
CPC ...... H03L 7/0814; H03L 7/0812; G11C 7/222
USPC .................................................. 327/149, 158
See application file for complete search history.

(56) References Cited

U.S. PATENT DOCUMENTS

| | | | | |
|---|---|---|---|---|
| 7,034,590 B2 * | 4/2006 | Shin | ............................... | 327/158 |
| 2005/0007166 A1 * | 1/2005 | Shin | ............................... | 327/158 |
| 2007/0046346 A1 * | 3/2007 | Minzoni | ....................... | 327/158 |
| 2009/0058481 A1 * | 3/2009 | Kim et al. | ..................... | 327/175 |
| 2009/0243685 A1 * | 10/2009 | Ooshima et al. | ............... | 327/175 |
| 2010/0083028 A1 * | 4/2010 | Oh | ................................ | 713/601 |
| 2010/0284489 A1 * | 11/2010 | Bae et al. | ....................... | 375/296 |
| 2011/0109354 A1 * | 5/2011 | Feng et al. | .................... | 327/156 |
| 2011/0169537 A1 * | 7/2011 | Ma | ................................ | 327/158 |
| 2011/0279156 A1 * | 11/2011 | Abbasi et al. | ................. | 327/158 |
| 2012/0086486 A1 * | 4/2012 | Na et al. | ......................... | 327/158 |
| 2012/0194241 A1 * | 8/2012 | Shin | ............................... | 327/158 |
| 2012/0280733 A1 * | 11/2012 | Zhu | ............................... | 327/175 |

(Continued)

FOREIGN PATENT DOCUMENTS

| KR | 10-2005-0048838 A | 5/2005 |
|---|---|---|
| KR | 10-2005-0058918 A | 6/2005 |
| KR | 10-2006-0000865 A | 1/2006 |
| KR | 10-0728906 B1 | 6/2007 |
| KR | 10-2010-0011282 A | 2/2010 |

*Primary Examiner* — Adam Houston

(57) ABSTRACT

A delayed locked loop (DLL) adjusts a duty cycle of an input clock signal and outputs an output clock signal. The DLL includes a phase and duty cycle detector configured to detect a phase and duty cycle of the input clock signal, a duty cycle corrector configured to correct the duty cycle, a control code generator configured to detect coarse lock of the DLL and generate a binary control code corresponding to the detection result, and a delay circuit configured to delay an output signal of the duty cycle corrector by a predetermined time according to the binary control code, tune the duty cycle thereof, and mix the phase thereof, wherein the phase and duty cycle detector, the duty cycle corrector, the control code generator, and the delay circuit form a feedback loop.

18 Claims, 19 Drawing Sheets

(56) References Cited

U.S. PATENT DOCUMENTS

2012/0293221 A1* 11/2012 Ma et al. .................. 327/156
2012/0326760 A1* 12/2012 Kesselring et al. ........... 327/175
2013/0082794 A1* 4/2013 Kris .............................. 332/108
2013/0257499 A1* 10/2013 Wang et al. .................. 327/175
2014/0002155 A1* 1/2014 Park et al. .................... 327/158

* cited by examiner

| Code | CD1 | CD2 | CD3 | CD4 | hfCLK | Mix1 | Mix2 |
|---|---|---|---|---|---|---|---|
| 0 | 0 | 0 | 0 | 1 | 0 | 0 | 1 |
| 1 | 0 | 0 | 2 | 1 | 0 | 2 | 1 |
| 2 | 1 | 0 | 2 | 1 | 1 | 3 | 2 |
| 3 | 1 | 0 | 2 | 3 | 1 | 3 | 4 |
| 4 | 2 | 0 | 2 | 3 | 2 | 4 | 5 |
| 5 | 2 | 0 | 4 | 3 | 2 | 6 | 5 |
| 6 | 3 | 0 | 4 | 3 | 3 | 7 | 6 |
| 7 | 3 | 0 | 4 | 5 | 3 | 7 | 8 |
| 8 | 4 | 0 | 4 | 5 | 4 | 8 | 9 |
| 9 | 4 | 1 | 4 | 5 | 4 | 9 | 10 |
| 10 | 5 | 1 | 4 | 5 | 5 | 10 | 11 |
| 11 | 5 | 2 | 4 | 5 | 5 | 11 | 12 |
| 12 | 6 | 2 | 4 | 5 | 6 | 12 | 13 |
| 13 | 6 | 3 | 4 | 5 | 6 | 13 | 14 |
| 14 | 7 | 3 | 4 | 5 | 7 | 14 | 15 |
| 15 | 7 | 4 | 4 | 5 | 7 | 15 | 16 |

*FIG. 11*

DELAY LOCKED LOOP WITH A LOOP-EMBEDDED DUTY CYCLE CORRECTOR

CROSS-REFERENCES TO RELATED APPLICATION

The present application claims priority to Korean patent application number 10-2012-0071347, filed on Jun. 29, 2012, which is incorporated by reference herein in its entirety.

BACKGROUND OF THE INVENTION

1. Field of the Invention

Embodiments of the present invention relates to a delay locked loop (DLL), and more particularly, to a DLL that includes a duty cycle corrector to correct a duty cycle of a DLL output signal and controls one delay circuit to be commonly used in a duty cycle correction operation and a locking operation of the DLL.

2. Description of the Related Art

In semiconductor circuit technology, a clock signal is used as a reference signal for adjusting operational timing in a system or circuit. When an external clock signal is inputted to a circuit or system, a clock skew inevitably occurs. Such a clock skew is typically corrected to generate an internal clock signal having the same phase as the external clock signal. To correct the clock skew, circuit technology such as a DLL or a phase locked loop (PLL) is used.

The DLL is less influenced by noise than the PLL. Therefore, the DLL is widely used in a synchronous semiconductor memory device such as a DDR SDRAM (Double Data Rate Synchronous DRAM).

Meanwhile, as semiconductor technology develops, the size of elements has been reduced, and an operating speed of the elements has gradually increased in proportion to the size reduction. The increase of the operating speed may distort a clock signal inputted to a circuit or system. Thus, a duty cycle of the clock signal may frequently deviate from 50%. The deviation may cause malfunction in the circuit or system such as a DDR system that operates based on rising and falling edges of the clock signal. Typically, such a problem is overcome by adding a duty cycle corrector (DCC) as illustrated in FIG. 1. As known to those skilled in the art, a duty cycle D is defined as the ratio between the pulse duration (t) and the period (T) in the case of a rectangular waveform (D=t/T), so that the pulse is active in the pulse duration (t).

However, the addition of the DCC may cause other problems. Although it is not illustrated in FIG. 1, the DCC 20 includes a delay circuit. In this case, the delay circuit and a replica delay circuit 17 included in a DLL 10 may increase the power consumption and chip area of the circuit or system. In addition, if an input clock signal RefCLK has a high frequency and a duty cycle of the input clock signal RefCLK deviates from approximately 50%, the input clock signal RefCLK may disappear while passing through a plurality of delay circuits in the DLL 10 and the DCC 20 as illustrated in FIG. 2 because the duty cycle D has decreased to approximately 0%. This may occur because NMOS and PMOS transistors in a CMOS logic circuit forming the delay circuit have different driving strengths from each other. As a result, a maximum operating frequency of the input clock signal RefCLK inputted to the DLL may be limited by this phenomenon.

SUMMARY OF THE INVENTION

Accordingly, embodiments of the present invention has been made in an effort to solve the problems occurring in the related art, and an advantage of an embodiment of the present invention is to provide a delayed locked loop (DLL) including a duty cycle corrector embedded therein, which is capable of reducing power consumption and chip area.

Another advantage of an embodiment of the present invention is to provide a DLL in which a duty cycle corrector is positioned in a feedback path of the DLL and provides a correction result to a phase and duty cycle detector to detect and compare phases and duty cycles of input and output clock signals of the DLL.

According to one embodiment of the present invention, there is provided a DLL that adjusts a duty cycle of an input clock signal and outputs an output clock signal. The DLL includes: a phase and duty cycle detector configured to detect a phase and duty cycle of the input clock signal; a duty cycle corrector configured to correct the duty cycle; a control code generator configured to detect coarse lock of the DLL and generate a binary control code corresponding to the detection result; and a delay circuit configured to delay an output signal of the duty cycle corrector by a predetermined time according to the binary control code, tune the duty cycle thereof, and mix the phase thereof, wherein the phase and duty cycle detector, the duty cycle corrector, the control code generator, and the delay circuit form a feedback loop.

BRIEF DESCRIPTION OF THE DRAWINGS

The above details, and other features and advantages of the present invention will become more apparent after a reading of the following detailed description taken in conjunction with the drawings, in which:

FIG. 11 is a table showing changes of coarse control codes CD1 to CD4 according to the increase of a control code during a coarse lock operation and the number of coarse delay units (CDUs) through which a half clock signal hfCLK and output clock signals Mix1 and Mix2 of third and fourth coarse delay circuits pass, according to an embodiment of the present invention;

DETAILED DESCRIPTION OF PREFERRED EMBODIMENTS

Figure 1:
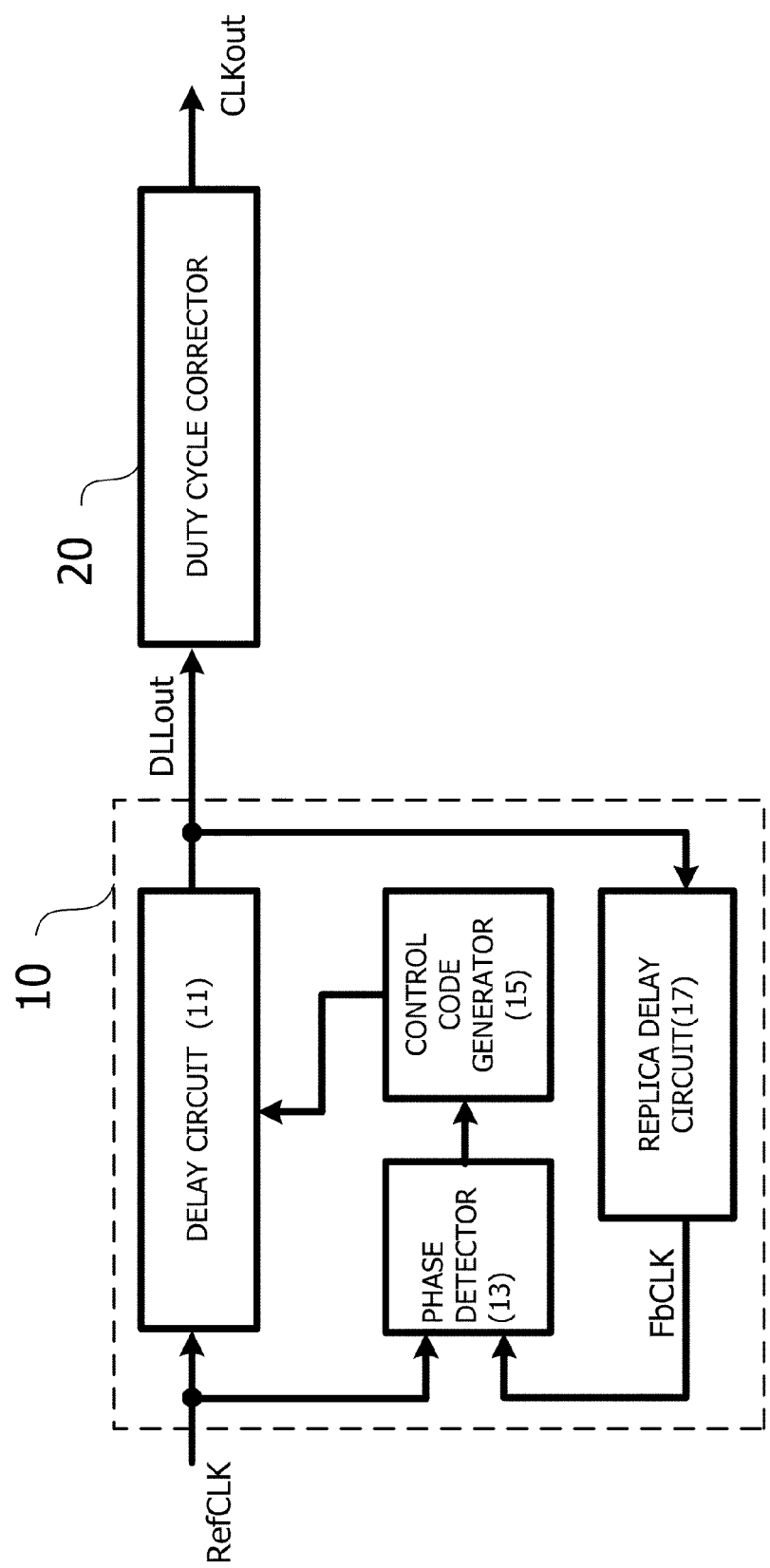
FIG. 1 illustrates a block diagram of a conventional duty cycle corrector and a conventional DLL.
Figure 2:
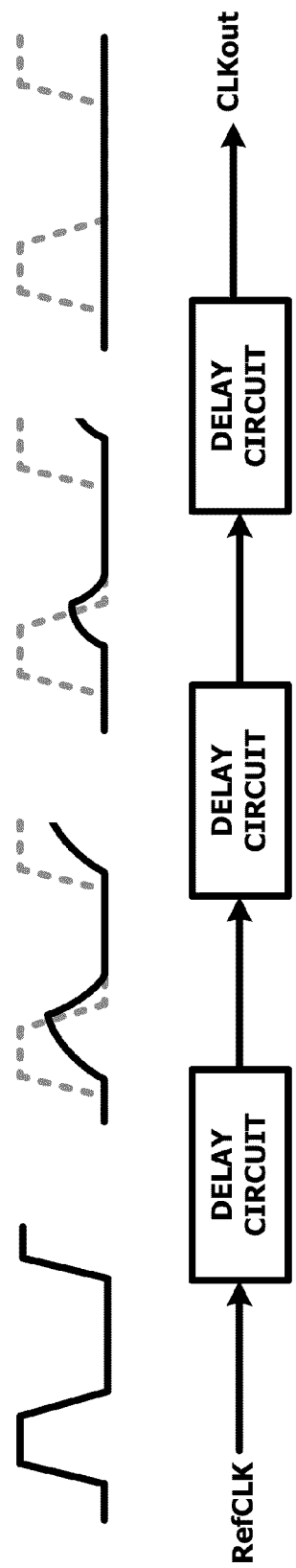
FIG. 2 is a waveform and block diagram illustrating that an input clock signal is distorted and finally disappear while passing through delay circuits.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
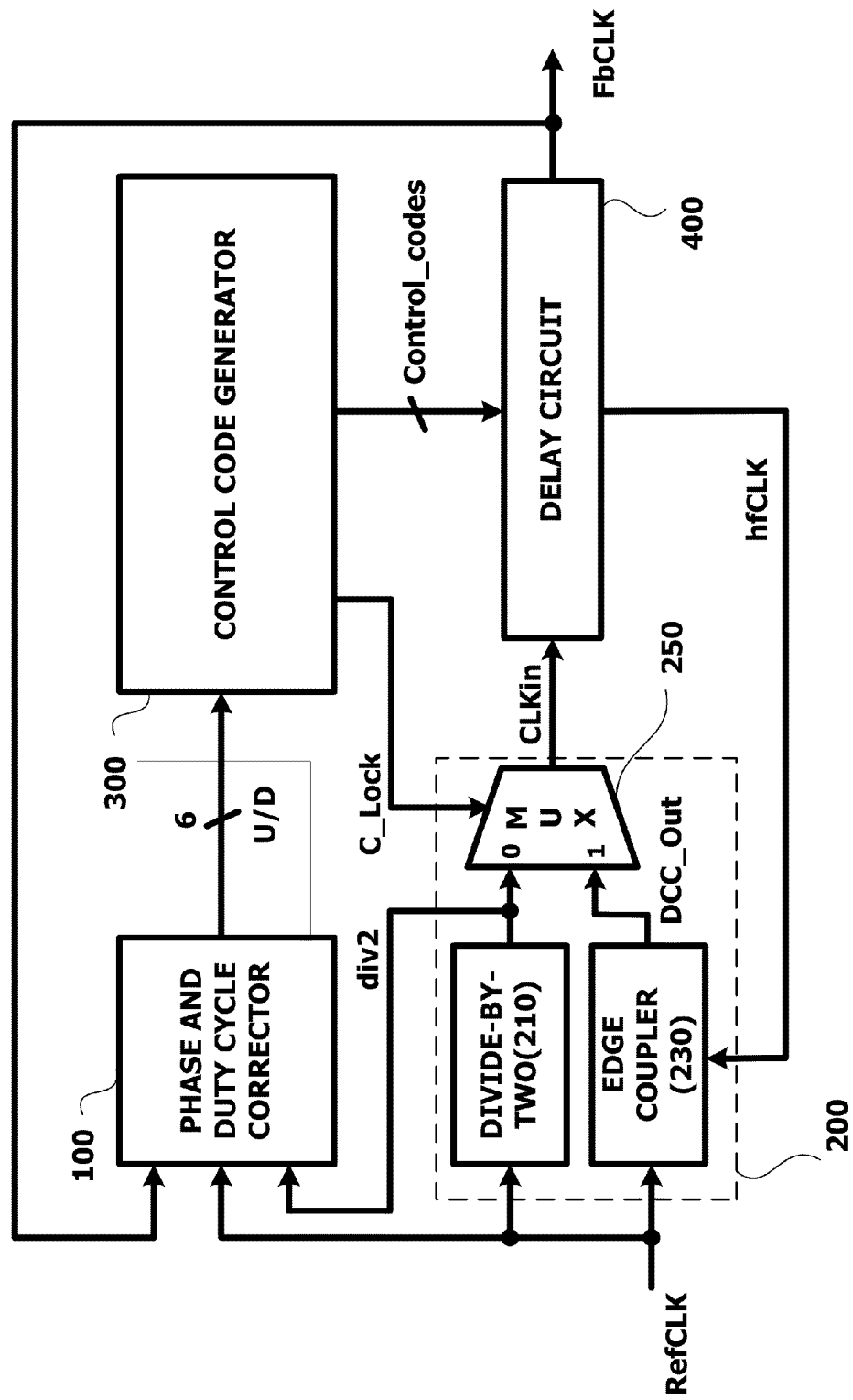
FIG. 3 illustrates a block diagram of a DLL including a duty cycle corrector embedded therein according to an embodiment of the present invention.

FIG. 3 illustrates a block diagram of a DLL according to an embodiment of the present invention.

Referring to FIG. 3, the DLL receives an input clock signal RefCLK and generates an output clock signal FbCLK of which a duty cycle is corrected to 50%. The DLL includes a phase and duty cycle detector 100, a duty cycle corrector 200, a control code generator 300, and a delay circuit 400.

The duty cycle corrector 200 is configured to receive the input clock signal RefCLK and output a clock signal CLKin of which a duty cycle corresponds to about 50%. For this operation, the duty cycle corrector 200 includes a divide-by-two circuit 210, an edge coupler 230, and a multiplexer (MUX) 250.

The edge coupler 230 is configured to receive the input clock signal RefCLK and a half clock signal hfCLK generated from the delay circuit 400 and generate an output signal DCC_Out increasing at a rising edge time of the input clock signal RefCLK and decreasing at a falling edge time of the half clock signal hfCLK.

The half clock signal hfCLK is obtained by delaying the input clock signal RefCLK by a predetermined time using the delay circuit 400, and has the same period Tref as the input clock signal RefCLK. Through a loop operation of the DLL, the rising edge time of the half clock signal hfCLK is adjusted to be delayed by (0.5)*(Tref) with respect to the rising edge time of the input clock signal RefCLK. Therefore, a duty cycle of the output signal DCC_Out of the edge coupler 230 is adjusted to be about 50% regardless of a duty cycle of the input clock signal RefCLK.

The divide-by-two circuit 210 serves to increase an operating frequency of the input clock signal RefCLK to a maximum value. While coarse lock is not achieved (i.e., C_Lock='0') at an initial stage of an operation of the DLL, a divided-by-two signal div2 obtained by dividing the input clock signal RefCLK by two is provided to an input terminal of the phase and duty cycle detector 101 of the DLL, and used to operate the DLL instead of the input clock signal RefCLK. Here, according to an embodiment, the divide-by-two signal div2 has a frequency that is a half of the frequency of the input clock signal RefCLK, but a duty cycle of the divided-by-two signal div2 is guaranteed to be 50%, regardless of the duty cycle of the input clock signal RefCLK. The divide-by-two circuit 210 outputs the divide-by-two signal div2 which is then received by the "0" terminal of the MUX 250 and is also received by the phase and duty cycle detector 100.

While the coarse lock is not achieved (i.e., C_Lock='0') at the initial stage of the DLL operation, the DLL operates in such a manner that a rising edge time of the output clock signal FbCLK of the DLL coincides with a falling edge time of the divided-by-two signal div2 output from the divide-by-two circuit 210. Accordingly, when the two edge times coincide with each other, the coarse lock operation is completed, and the coarse lock signal C_Lock becomes '1'. At this time, the entire delay time of the delay circuit 400 becomes one-half (or a half) of a period (2Tref) of the divided-by-two signal div2. That is, the entire delay time is equal to the period Tref of the input clock signal RefCLK. Therefore, the delay time of the half clock signal hfCLK with respect to the input signal CLKin of the delay circuit 400 becomes one-half of the period Tref of the input clock signal RefCLK. This is because the half clock signal hfCLK is extracted at the center tap position of the delay circuit 400.

Terminology such as 'coarse' used in the entire specification has a meaning distinguishable from a meaning of 'fine'. Through a coarse circuit operation, a rough result may be obtained. After the coarse circuit operation is completed, a fine circuit operation is repetitively performed to obtain a more precise result than the previous rough result. The fine circuit operation refers to a multi-stage operation through which a result of the coarse and fine circuit operation may reach a desired result. Such a multi-stage operation may be performed when it is difficult to obtain the desired result through one circuit operation. The multi-stage operation may be performed through two or more stages. The terms will have the same meanings as described above in the following descriptions.

After the coarse lock operation is completed so that the coarse lock signal C_Lock becomes '1', the DLL operates to equalize the rising edge time of the input clock signal RefCLK to the rising edge time of the output clock signal FbCLK. At this time, the output signal DCC_Out of the edge coupler 230 is received by the "1" input terminal of the MUX 250, and the MUX 250 outputs the clock signal CLKin. The delay circuit 400 receives the clock signal CLKin from the duty cycle corrector 200.

If the coarse lock is achieved, even though the duty cycle of the input clock signal RefCLK significantly deviates from 50%, the duty cycle of the output signal DCC_Out of the edge coupler 230 is maintained at 50% because the delay time of the half clock signal hfCLK with respect to the input signal CLKin of the delay circuit 400 is one-half of the period Tref of the input clock signal RefCLK. Accordingly, the operating frequency of the input clock signal RefCLK increases to the maximum value.

Figure 4:
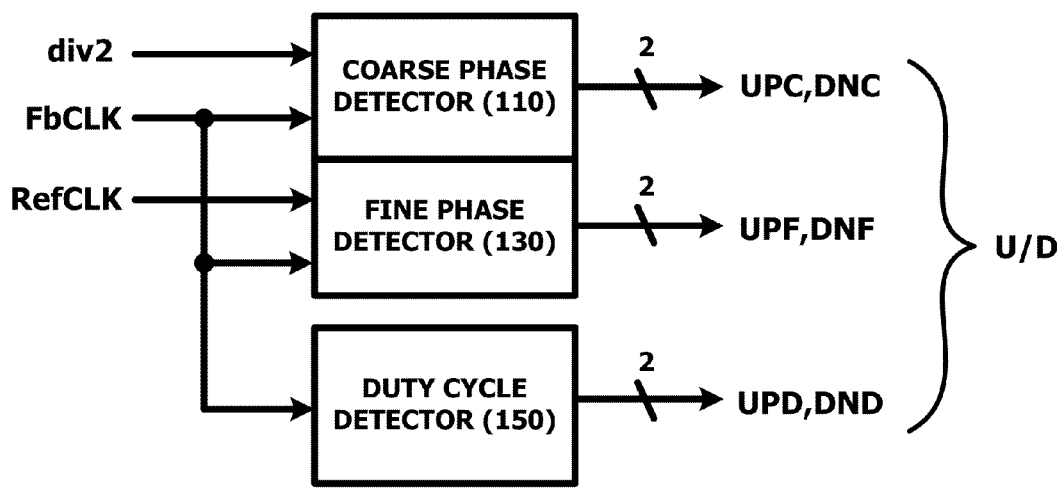
FIG. 4 illustrates a detailed block diagram of a phase and duty cycle detector illustrated in FIG. 3, according to an embodiment of the present invention.

Referring to FIG. 4, the phase and duty cycle detector 100 includes a coarse phase detector 110, a fine phase detector 130, and a duty cycle detector 150. The coarse phase detector 110 is configured to compare phases of the output clock signal FbCLK and the divided-by-two signal div2 and output coarse up/down signals UPC and DNC while coarse lock is not achieved (i.e., C_Lock='0') at the initial stage of the DLL operation. The fine phase detector 130 is configured to compare phases of the input clock signal RefCLK and the output clock signal FbCLK and output fine up/down signals UPF and DNF after the coarse lock operation is completed and the coarse lock signal C_Lock changes to '1'. The duty cycle detector 150 is configured to determine whether the duty cycle of the output clock signal FbCLK is smaller or greater than approximately 50% and output duty cycle up/down signals UPD and DND.

Referring back to FIG. 3, the control code generator 300 has a function of detecting coarse lock of the DLL, a function of generating a delay code corresponding to delay information of the output clock signal FbCLK, and a function of generating a phase code corresponding to phase information of the output clock signal FbCLK.

Figure 5:
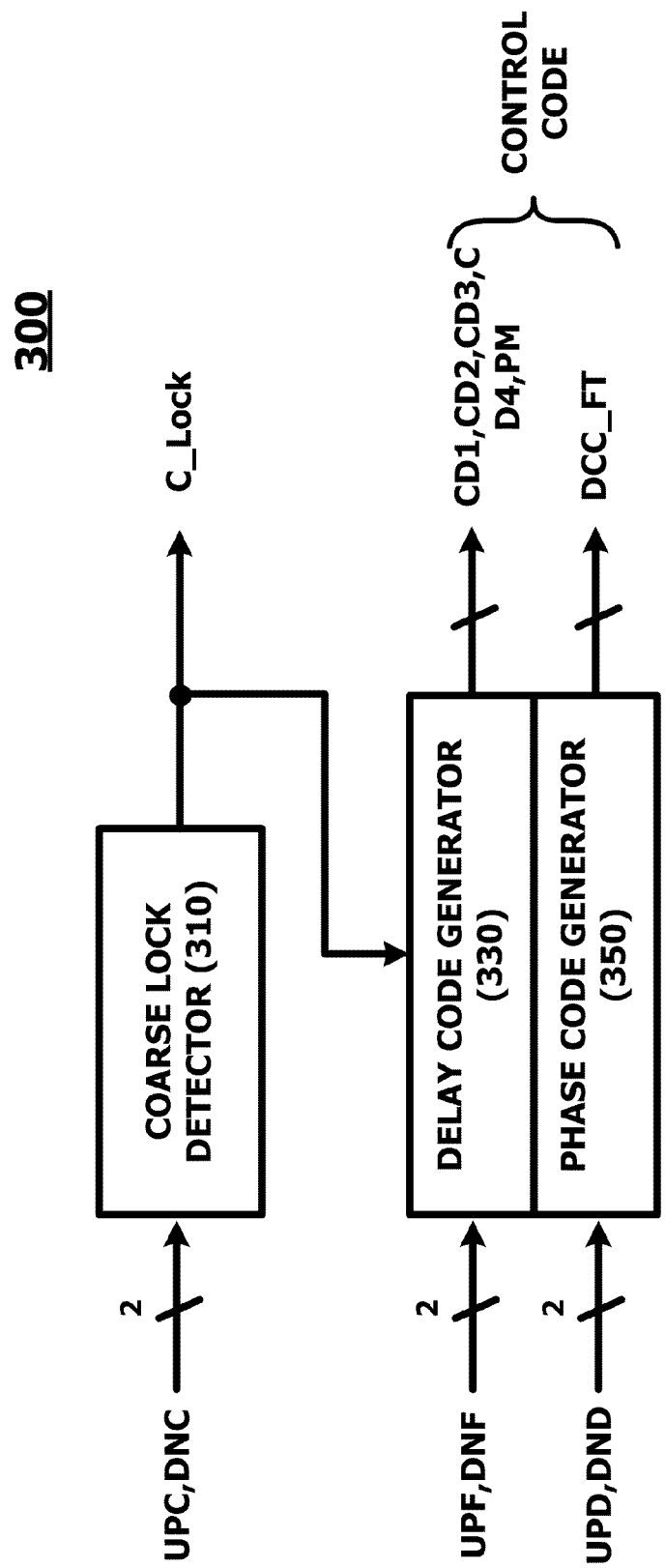
FIG. 5 illustrates a detailed block diagram of a control code generator illustrated in FIG. 3, according to an embodiment of the present invention.

Referring to FIG. 5, in order to perform the above functions, the control code generator 300 includes a coarse lock detector 310, a delay code generator 330, and a phase code generator 350.

The coarse lock detector 310 is configured to receive the coarse up/down signals UPC and DNC outputted from the coarse phase detector 110 of the phase and duty cycle detector 100 and generate the coarse lock signal C_Lock. The delay code generator 330 is configured to receive the fine up/down signals UPF and DNF outputted from the fine phase detector 130 of the phase and duty cycle detector 100 and generate delay control codes CD1, CD2, CD3, CD4, and PM. The phase code generator 350 is configured to receive the duty cycle up/down signals UPD and DND outputted from the duty cycle detector 150 of the phase and duty cycle detector 100 and generate a duty cycle control code DCC_FT.

Referring back to FIG. 3, the delay circuit 400 may be set to have a minimum delay time at the initial stage of the DLL operation. The minimum delay time is smaller than the period Tref of the input clock signal RefCLK. Furthermore, the divided-by-two signal div2 obtained by dividing the input clock signal RefCLK by two is used as an input signal of the phase and duty cycle detector 100 and an input signal of the delay circuit 400 at the initial stage of the DLL operation. Therefore, at the initial stage of the DLL operation, i.e., while the coarse lock is not achieved, the divided-by-two signal div2 have a period two times longer than the period Tref of the input clock signal RefCLK and a duty cycle corresponding to approximately 50%.

Figure 6:
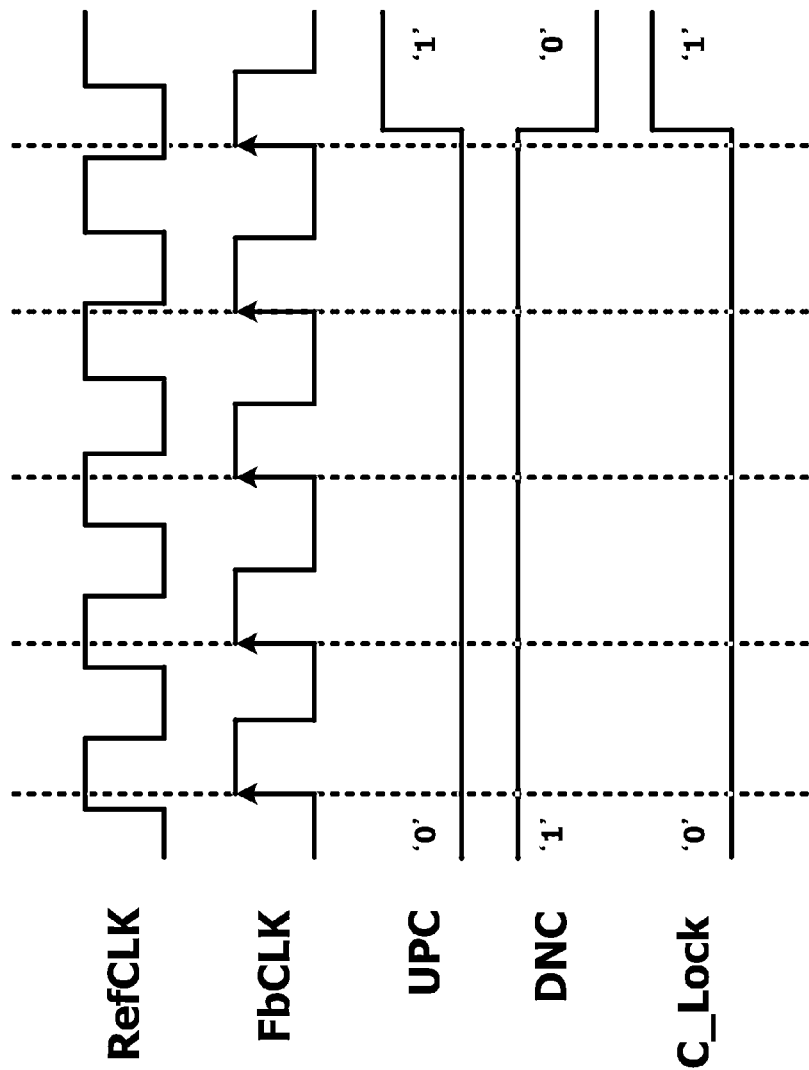
FIG. 6 is a waveform diagram illustrating an operation of a coarse lock detector illustrated in FIG. 5, according to an embodiment of the present invention.

FIG. 6 illustrates an operation of the coarse lock detector 310 shown in FIG. 5. At the initial stage of the DLL operation, the output clock signal FbCLK of the DLL has a smaller delay time than the period Tref of the input clock signal RefCLK, compared to the divided-by-two signal div2. This is because an initial delay time of the delay circuit 400 at the initial stage of the DLL operation is set to be smaller than the period Tref of the input clock signal RefCLK.

Therefore, at the initial stage of the DLL operation, the coarse up/down signals UPC and DNC of the coarse phase detector 110 become '0' and '1', respectively, and the coarse lock signal C_Lock becomes '0'. During a period of time in which the coarse lock signal C_Lock is '0', the delay code generator 330 of FIG. 5 generates the delay control codes CD1 to CD4 and PM to successively increase the delay time of the delay circuit 400 with respect to time. Therefore, when the delay time for the output clock signal FbCLK of the DLL gradually increases to be equalized to the period Tref of the input clock signal RefCLK, the coarse up/down signals UPC and DNC of the coarse phase detector 110 change to '1' and '0', respectively, and the coarse lock signal C_Lock changes to '1'. At this time, the delay time of the output clock signal FbCLK with respect to the input signal CLKin of the delay circuit 400 is equalized to the period Tref of the input clock signal RefCLK of the DLL, and the delay time of the half clock signal hfCLK with respect to the input signal CLKin is equalized to one-half of the period Tref.

When the coarse lock signal C_Lock becomes '1', the output signal DCC_Out of the edge coupler 230 is used as the input signal CLKin of the delay circuit 400. In this case, MUX 250 selects the signal DCC_Out at the input terminal "1" of the MUX 250 as the signal CLKin to be generated/output by the MUX 250, when the coarse lock signal C_Lock (which is a control signal for the MUX 250) is "1". The output signal DCC_Out of the edge coupler 230 has the same frequency as the input clock signal RefCLK, but has a different duty cycle from the input clock signal RefCLK. Furthermore, when the coarse lock signal C_Lock becomes '1', the delay code generator 330 of FIG. 5 generates the delay control codes CD1 to CD4 and PM using the fine up/down signals UPF and DNF of the fine phase detector 130. The fine phase detector 130 compares the phases of the input clock signal RefCLK and the output clock signal FbCLK and outputs the fine up/down signals UPF and DNF. Accordingly, immediately after the coarse lock signal C_Lock changed to '1', the delay time of the output clock signal FbCLK with respect to the input clock signal RefCLK is substantially equalized to the period Tref, and the duty cycle of the output clock signal FbCLK is substantially equalized to 50%.

When the coarse lock signal C_Lock becomes '1', the phase code generator 350 of FIG. 5 outputs the duty cycle control code DCC_FT using the duty cycle up/down signals UPD and DND of the duty cycle detector 150.

Figure 7:
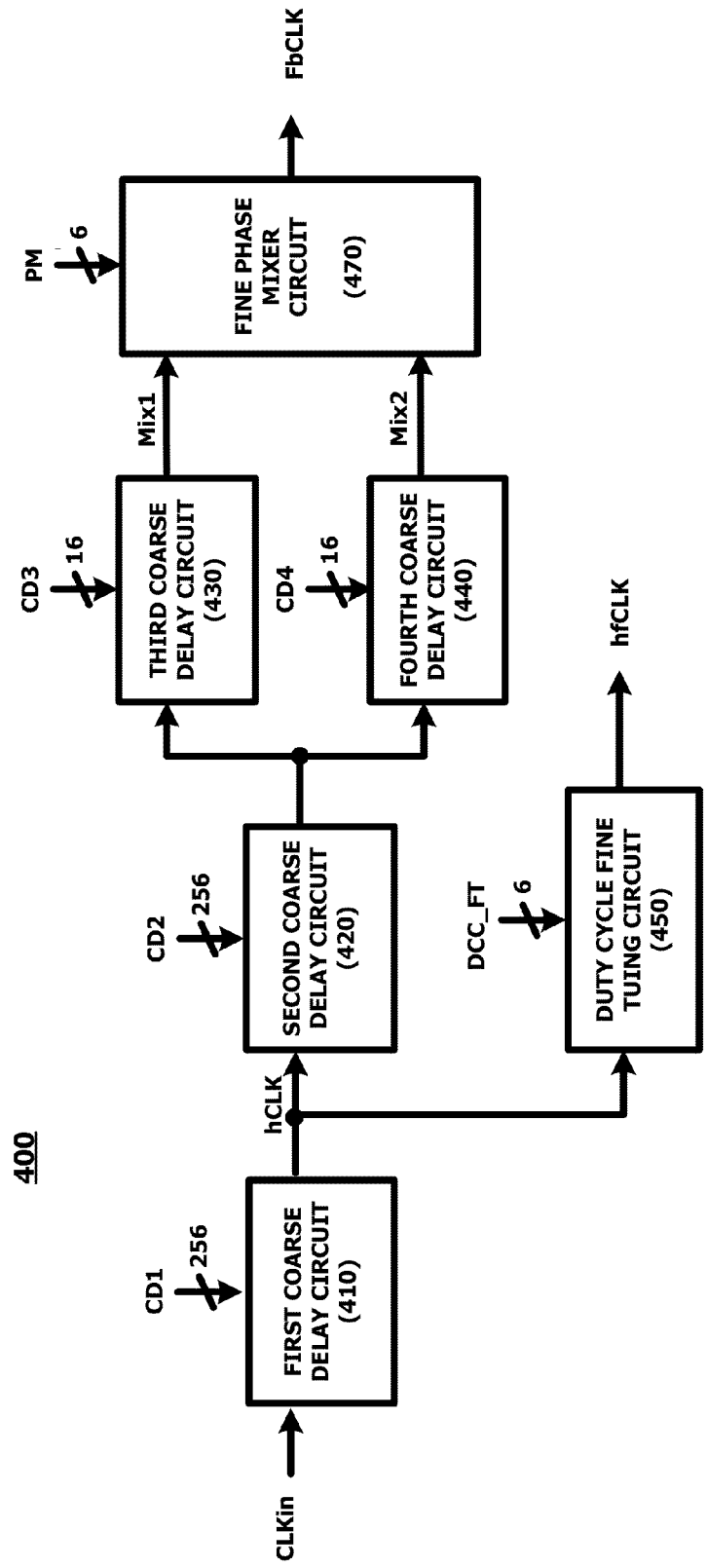
FIG. 7 illustrates a detailed block diagram of a delay circuit illustrated in FIG. 3, according to an embodiment of the present invention.

FIG. 7 illustrates a detailed block diagram of the delay circuit 400 shown in FIG. 3. The delay circuit 400 receives the input signal CLKin outputted from the duty cycle corrector 200 and the control codes CD1 to CD4, PM, and DCC_FT outputted from the control code generator 300, sequentially delays the input signal CLKin by delay times determined in response to the control codes CD1 to CD4 and PM, and outputs the delayed signal as the output clock signal FbCLK. At this time, the delay circuit 400 also generates the half clock signal hfCLK by delaying the input signal CLKin by one-half of the delay time for generating the output clock signal FbCLK.

In order to perform the above operation, the delay circuit 400 includes first to fourth coarse delay circuits 410 to 440, a duty cycle fine tuning circuit 450, and a fine phase mixer circuit 470. At the initial stage of the DLL operation, i.e., when the coarse lock signal C_Lock is '0', the fine phase mixer circuit 470 has a delay time set to a minimum value almost close to '0'. Then, when the coarse lock signal C_Lock changes to '1', the delay time of the fine phase mixer circuit 470 is adjusted to be within about 10% of the entire delay time of the delay circuit 400.

When the coarse lock signal C_Lock is '0', a delay time of the first coarse delay circuit 410 is adjusted to be about one-half of the entire delay time of the delay circuit 400.

Immediately after the coarse lock signal C_Lock changed to 1, the entire delay time of the delay circuit 400 is equalized to the period Tref of the input clock signal RefCLK. Therefore, a delay time of an output signal hCLK of the first coarse delay circuit 410 becomes almost one-half of the period Tref with respect to the input signal CLKin. The output signal hCLK of the first coarse delay circuit 410 is outputted as the half clock signal hfCLK through the duty cycle fine tuning circuit 450.

Figure 8:
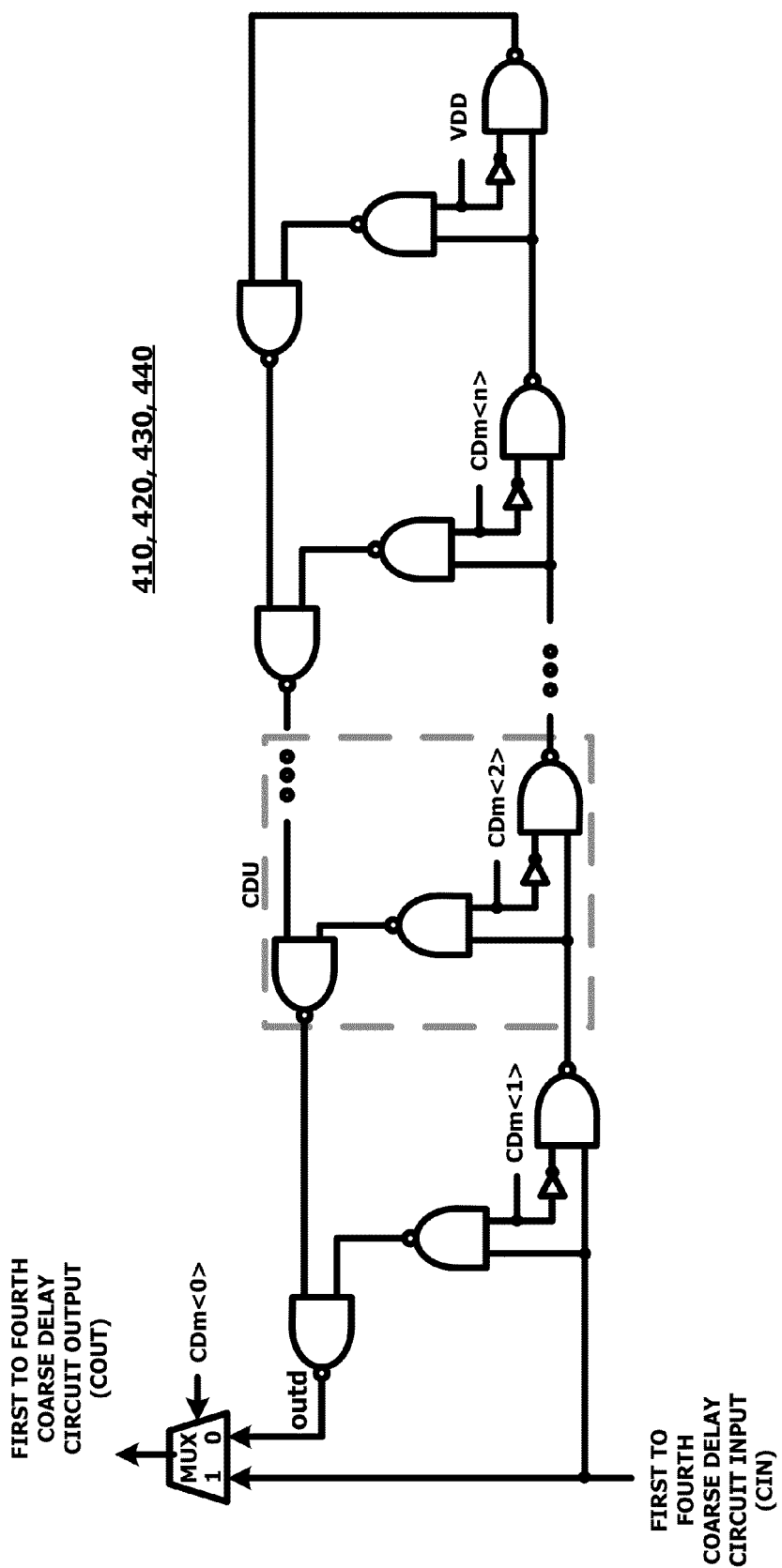
FIG. 8 illustrates a detailed circuit diagram of each of first to fourth coarse delay circuits illustrated in FIG. 6, according to an embodiment of the present invention.

Each of the first and second coarse delay circuits 410 and 420 of FIG. 7 includes 256 coarse delay units (CDUs) coupled in series, in one embodiment as illustrated in FIG. 8. Similarly, each of the third and fourth coarse delay circuits 430 and 440 includes 16 CDUs coupled in series, in one embodiment. The number of CDUs included in each of the coarse delay circuits 410 to 440 may be properly increased or decreased, if necessary, and thus specific configurations of the coarse delay circuits 410 to 440 may be modified. For convenience of description, a thermometer control code of the duty cycle fine tuning circuit 450 is represented by "DCC_FT", and a thermometer control code of the fine phase mixer circuit 470 is represented by "PM".

Referring to FIG. 8, the coarse delay circuit uses a control code CDm<0:N> as a thermometer code, where N is an integer. If the control code CDm<0:N> has a code value of '1111 ... 1', a coarse delay circuit input CIN is directly output as a coarse delay circuit output COUT through a multiplexor MUX. Therefore, a delay time of the coarse delay circuit is minimized. At this time, the coarse delay circuit input CIN does not pass through any CDUs.

If the control code CDm<0:N> has a value of '0111 ... 1', the coarse delay circuit input CIN passes through the first-stage CDU and the MUX and is then output as the coarse delay circuit output COUT. Therefore, the delay time of the coarse delay circuit increases by a delay time of one CDU, i.e., one CDU delay time, compared to the delay time when the control code CDm<0:N> has a value of '1111 ... 1'. In FIG. 8, one CDU delay time corresponds to a propagation time of two NAND gates.

If the control code CDm<0:N> has a value of '0000 ... 0', the delay time of the coarse delay circuit is maximized. In this case, the delay time of the coarse delay circuit increases by (N+1) CDU delay times, compared to the delay time when the control code CDm<0:N> has a value of '1111 ... 1'.

Figure 9:
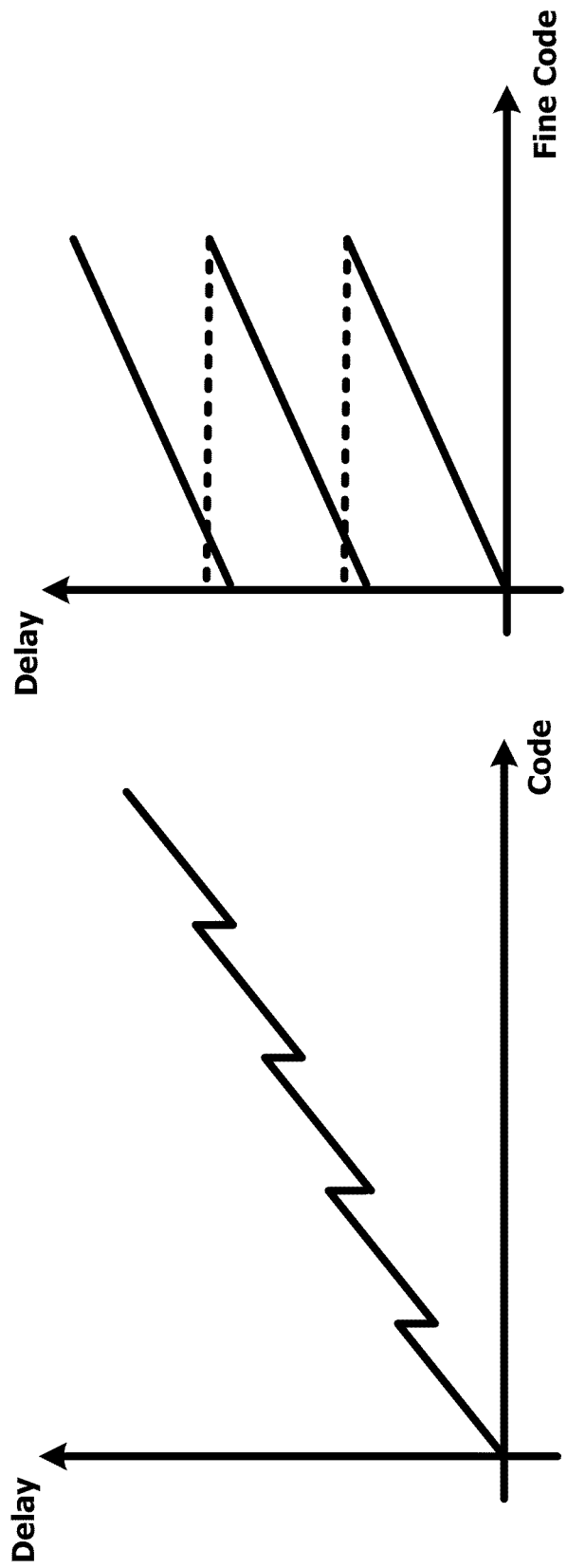
FIG. 9 is a graph illustrating a delay time change of a conventional coarse-fine delay circuit according to the increase of a code value.

In a conventional delay circuit divided into coarse and fine delay circuits, when a delay time moves to a coarse value from a boundary value of a fine code, the delay time of the delay circuit may have a non-linear section as illustrated in a left-side graph of FIG. 9. That is, if the fine delay circuit has a maximum delay time, the delay time of the coarse delay circuit increases by one unit coarse delay time, and then the delay time of the fine delay circuit reduces to a minimum value, so that the delay time of the fine delay circuit increases again, as illustrated in a right-side graph (labeled as "Fine Code" graph) of FIG. 9. The increase of the delay time of the coarse delay circuit is different from the increase of a unit fine delay time, which is generated while the fine code increases. Therefore, the delay time of the delay circuit has a non-linear section as illustrated in FIG. 9. Accordingly, the delay time of the delay circuit of the DLL does not linearly increase with respect to the unit code change, resulting in the generation of jitter.

In order to solve the problem, in accordance with an embodiment, the third coarse delay circuit 430, the fourth coarse delay circuit 440, and the fine phase mixer circuit 470 are employed to thereby implement a seamless boundary switching method through the use of double coarse delay circuits.

Figure 10:
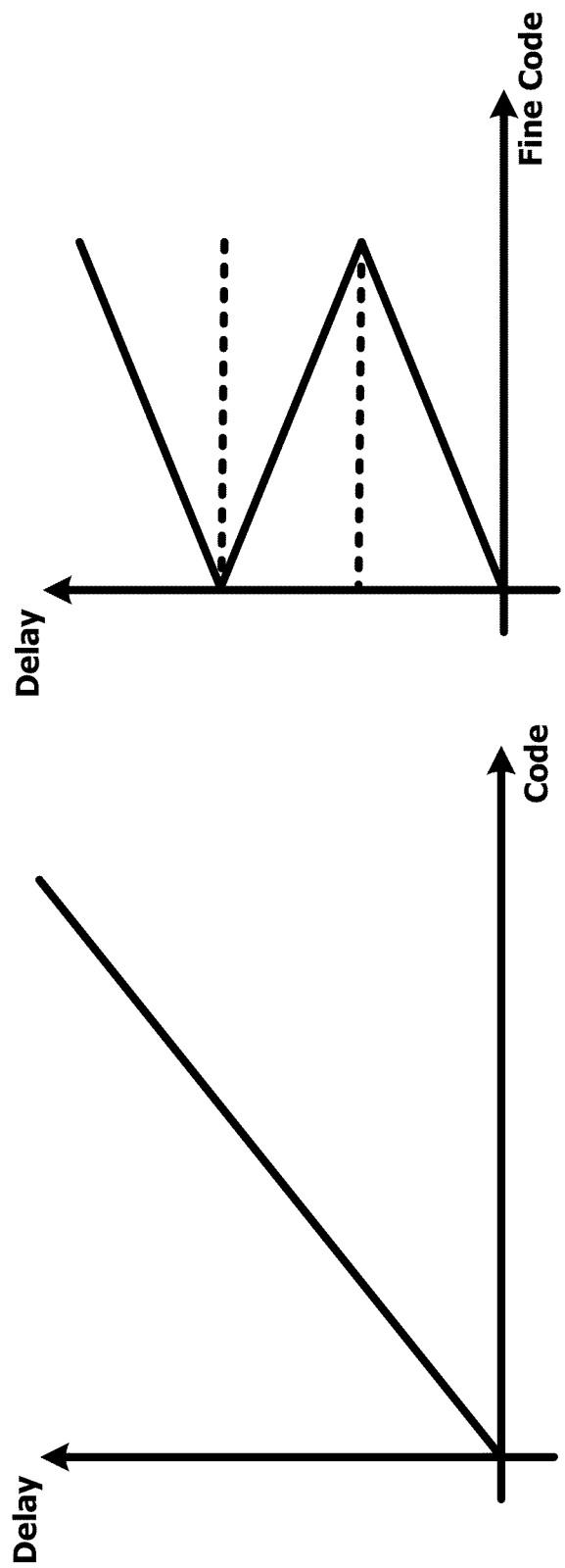
FIG. 10 is a graph illustrating a delay time change in a seamless boundary switching method according to the increase of a code value, according to an embodiment of the present invention.

FIG. 10 is a graph showing a delay time change in the seamless boundary switching method according to the increase of a code value, in accordance with an embodiment of the present invention. For example, suppose that an output clock signal Mix2 of the fourth coarse delay circuit 440 is delayed by one unit coarse delay time from an output clock signal Mix1 of the third coarse delay circuit 430. At this time, in order to increase the delay time of the output clock signal FbCLK of the DLL, the fine phase mixer circuit 470 may give a weight to the output clock signal Mix2 of the fourth coarse delay circuit 440 rather than the output clock signal Mix1 of the third course delay circuit 430. When the fine phase mixer circuit 470 gives all weights to the output clock signal Mix2 of the fourth coarse delay circuit 440, the delay time may continuously increases as follows. First, if the output clock signal Mix1 of the third coarse delay circuit 430 is delayed by two unit coarse delay times, the output clock signal Mix1 is delayed by one unit coarse delay time from the output clock signal Mix2 of the fourth coarse delay circuit 440. Then, the delay time may increases while the fine phase mixer circuit 470 gradually gives a weight to the output clock signal Mix1 of the third coarse delay circuit 430. When the delay time moves to a coarse value from the boundary of the fine code as described above, it may correspond to a moment when the delay time of the output clock signal Mix1 of the third coarse delay circuit 430 increases by two unit coarse delay times. At this time, since all weights were given to the output clock signal Mix2 of the fourth coarse delay circuit, no jitter occurs in the output clock signal FbCLK of the DLL. Accordingly, it is possible to implement the seamless boundary switching method capable of preventing jitter from occurring in the boundary of the fine code of the conventional coarse-fine delay circuit.

FIG. 11 is a table showing changes of the coarse control codes CD1 to CD4 according to the increase of the control code during the coarse lock operation and changes of the number of CDUs through which the half clock signal hfCLK and the output clock signals Mix1 and Mix2 of the third and fourth coarse delay circuits 430 and 440 pass, in accordance with an embodiment of the present invention. In order to maintain a state in which the half clock signal hfCLK is delayed by the half of the delay time of the entire delay circuit, a delay time of the coarse delay circuit at a previous stage of the half clock signal hfCLK, for example, the first coarse delay circuit 410, is set to be approximate to a total delay time of the coarse delay circuits at the next stage, for example, the second to fourth coarse delay circuits 420 to 440. For this operation, the delay time of the first coarse delay circuit 410 and that of the third or fourth coarse delay circuit 430 or 440 alternately increase. In this case, the delay time increasing operation may be performed in order of 1-3-1-4-1-3-1-4, each of the numbers representing a corresponding coarse delay circuit.

More specifically, when the delay times increase, the delay time of the first coarse delay circuit 410 at the previous stage of the half clock signal hfCLK is set to be approximate to the sum of the delay times of the second and third coarse delay circuits 420 and 430 or the sum of the delay times of the second and fourth coarse delay circuits 420 and 440 at the next stage of the half clock signal hfCLK such that the half clock signal hfCLK has center tap information. This information is required for a duty cycle correction operation.

At this time, as the delay times of the third and fourth coarse delay circuits 430 and 440 gradually increase, each of the third and fourth coarse delay circuits 430 and 440 may have a delay time corresponding to one-half of the length of the entire delay circuit. This state may be referred to as a seamless code lock state. For example, suppose that the delay circuit 400 can delay a signal by approximately 5 ns from the minimum delay. In this case, if the third coarse delay circuit 430 delays a signal by approximately 2.5 ns, it may correspond to a state in which the signal is delayed by the half of the length of the entire delay circuit.

Before reaching the seamless code lock state, the delay time of the first coarse delay circuit 410 increases by one time in a state in which the second coarse delay circuit 420 is fixed to the minimum delay. Then, the delay time of the third or fourth coarse delay circuit 430 or 440 increases by one time such that the half clock signal hfCLK is positioned at the half of the length of the entire delay circuit.

If the above-described seamless code lock is achieved, the delay time of the first coarse delay circuit 410 increases by one time in a state in which the delay times of the third and fourth coarse delay circuits 430 and 440 are fixed, and the delay time of the second coarse delay circuit 420 then increases to position the half clock signal hfCLK at the half of the length of the entire delay circuit. In this case, the delay time increasing operation may be performed in order of 1-2-1-2-1-2-1-2 . . . , each of the numbers representing a corresponding coarse delay circuit.

All of the above-described circuit operations are related to the coarse lock. The reason of increasing the delay times of the third and fourth coarse delay circuits 430 and 440 only till the seamless code lock state is to provide the maximum extra delay time when the third and fourth coarse delay circuits 430 and 440 are used to perform the seamless boundary switching method after the coarse lock is achieved.

As a result, during the coarse lock operation, the delay times of the third and fourth coarse delay circuits 430 and 440 increase up to the half of the length of the entire delay circuit. When the third and fourth coarse delay circuits 430 and 440 and the fine phase mixer circuit 470 are used to perform the seamless boundary switching method after the coarse lock is achieved, the largest range of delay times may be set from top to bottom. After the delay times of the third and fourth coarse delay circuits 430 and 440 increase by the half of the length of the entire delay circuit, the delay times of the first and second coarse delay circuits 410 and 420 alternately increase. That is, when the coarse delay circuits operate in order of "1-2-1-2-1-2-1-2 . . . ", the half clock signal hfCLK maintains a state in which it delays by the half of the delay time of the output clock signal FbCLK of the DLL.

Figure 12:
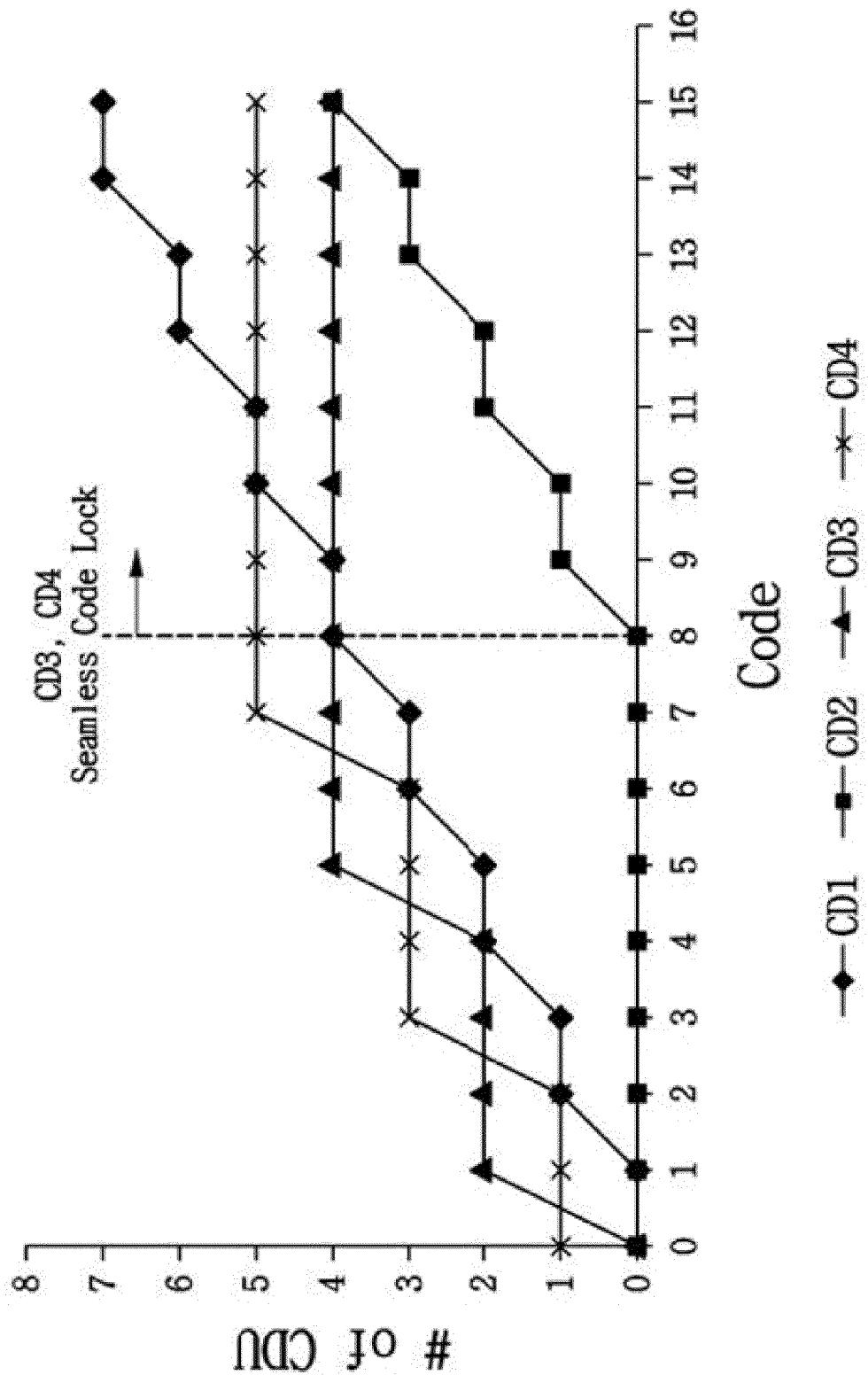
FIG. 12 is a graph illustrating changes of the respective coarse control codes CD1 to CD4 according to the increase of the control code during the coarse lock operation, according to an embodiment of the present invention.

FIG. 12 is a graph illustrating changes of the respective coarse control codes CD1 to CD4 according to the increase of the control code during the coarse lock operation, in accordance with an embodiment of the present invention. In order to perform the seamless boundary switching method, the coarse control codes CD3 and CD4 have a delay code difference of 1 CDU from each other, and increase by 2 CDUs. In FIG. 12, a moment when the delay times of the third and fourth coarse delay circuits 430 and 440 increase to the half of the length of the entire delay circuit is represented by "Seamless Code Lock." From this moment, the coarse control codes CD3 and CD4 do not change, and the coarse control codes CD2 and CD1 alternately increase.

Figure 13:
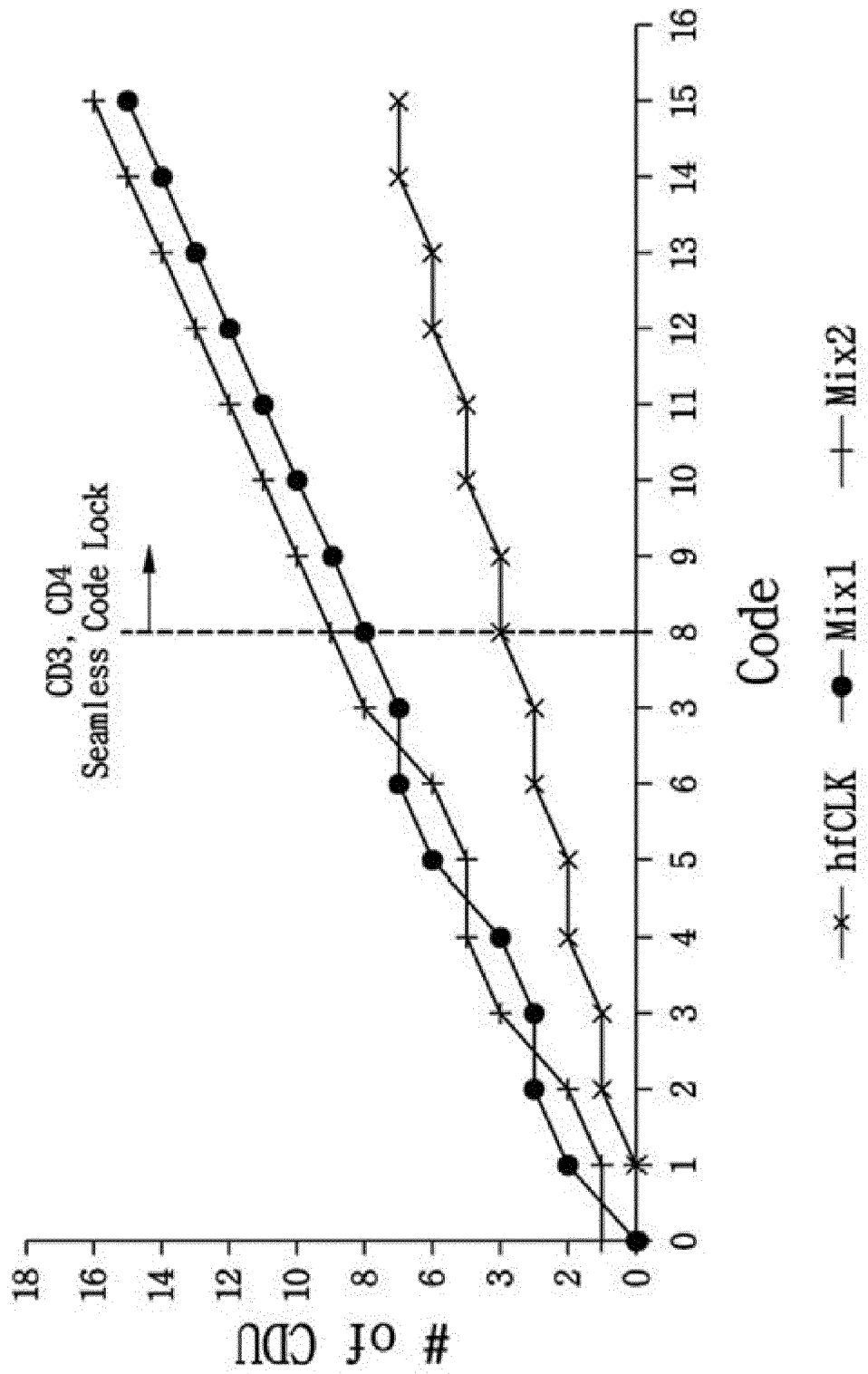
FIG. 13 is a graph illustrating changes in the numbers of CDUs through which the half clock signal hfCLK and the output clock signals Mix1 and Mix2 of the third and fourth coarse delay circuits pass, according to the increase of the control code during the coarse lock operation, according to an embodiment of the present invention.

FIG. 13 is a graph illustrating changes in the numbers of CDUs through which the half clock signal hfCLK and the output clock signals Mix1 and Mix2 of the third and fourth coarse delay circuits 430 and 440 pass, according to the increase of the control code during the coarse lock operation, in accordance with an embodiment of the present invention. The half clock signal hfCLK corresponds to CD1, the output clock signal Mix1 of the third coarse delay circuit 430 corresponds to CD1+CD2+CD3, and the output clock signal Mix2 of the fourth coarse delay circuit 440 corresponds to CD1+CD2+CD4. Referring to FIG. 13, it can be seen that the numbers of CDUs through which the output clock signals Mix1 and Mix2 pass alternately increase while maintaining a difference of 1 CDU therebetween, before the seamless code lock is achieved. After the seamless code lock is achieved, the numbers of CDUs through which the output clock signals Mix1 and Mix2 pass simultaneously increase while maintaining a difference of 1 CDU therebetween. Before and after the seamless code lock is achieved, the number of CDUs through which the half clock signal hfCLK passes increases while the delay time corresponding to the half of the length of the delay circuit is maintained.

Figure 14:
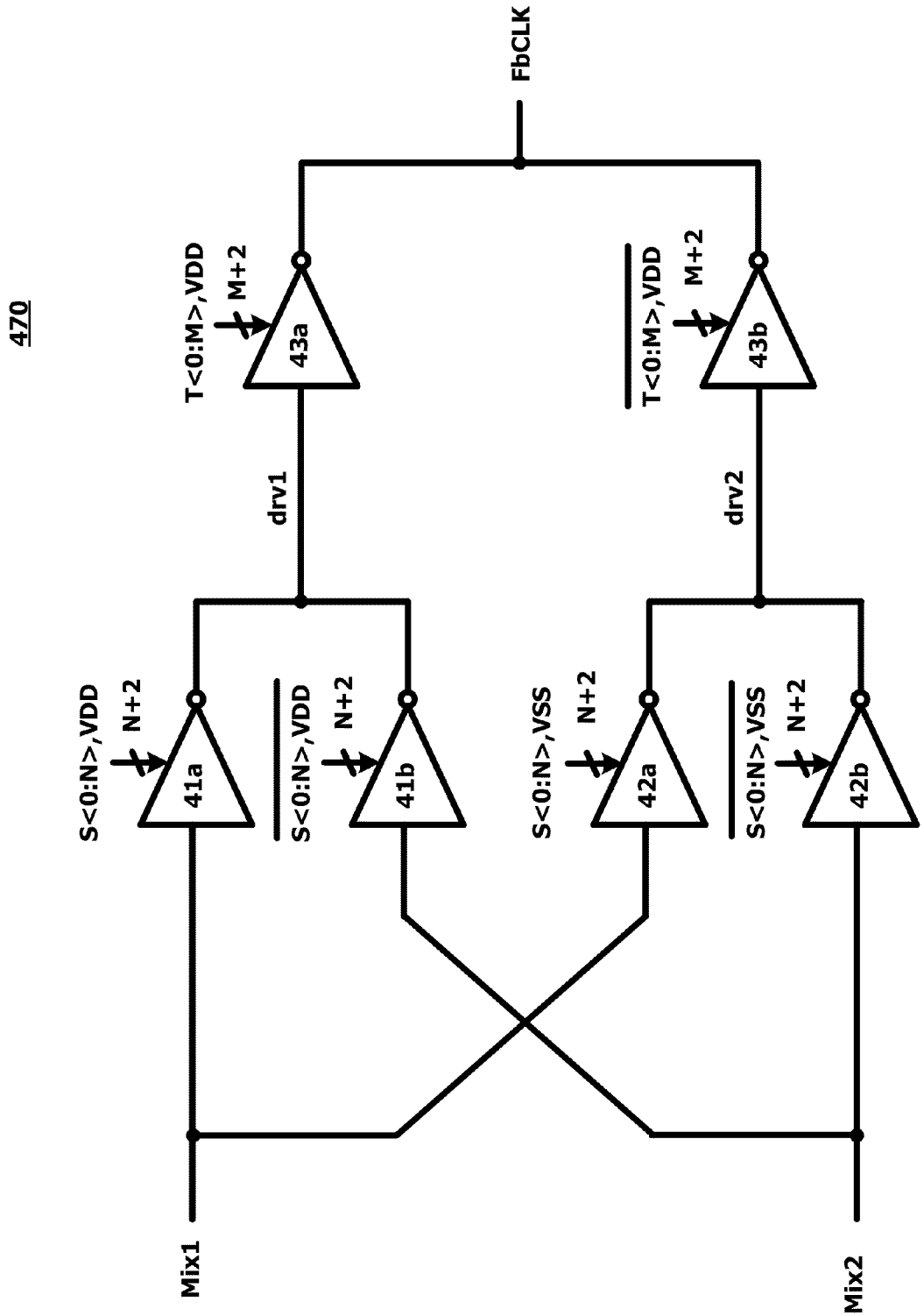
FIG. 14 illustrates a detailed circuit diagram of a fine phase mixer circuit illustrated in FIG. 7, according to an embodiment of the present invention.
Figure 15:
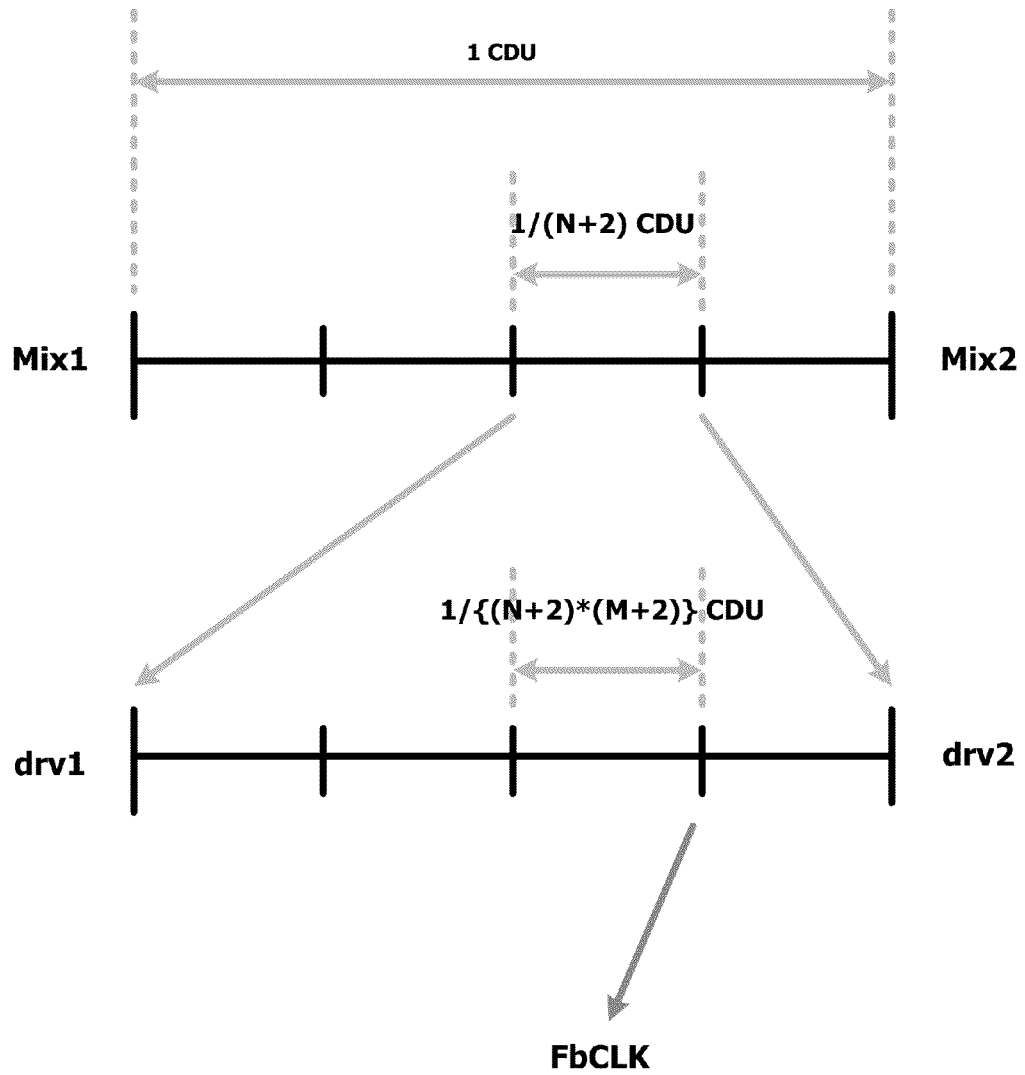
FIG. 15 is a diagram explaining an operation of the fine phase mixer circuit illustrated in FIG. 14, according to an embodiment of the present invention.

FIG. 14 illustrates a detailed circuit diagram of the fine phase mixer circuit 470, according to an embodiment of the present invention. FIG. 15 is a diagram for explaining an operation of the fine phase mixer circuit 470, according to an embodiment of the present invention. The fine phase mixer circuit 470 performs a phase mixing operation through two stages according to two thermometer control codes S<0:N> and T<0:M>. The two thermometer control codes S<0:N> and T<0:M> have been represented by "PM" in FIG. 7. At the first stage as illustrated in FIG. 14, two input signals Mix1 and Mix2 having a time difference corresponding to one CDU are mixed by a (N+1)-bit control code S<0:N>, and two intermediate clock signals drv1 and drv2 having a time difference corresponding to 1/(N+2) CDU are generated. At the second stage, the two intermediate clock signals drv1 and drv2 are mixed by a (M+1)-bit control code T<0:M>, and the DLL output clock signal FbCLK having a resolution corresponding to $1/\{(N+2)*(M+2)\}$ CDU is generated.

Figure 16:
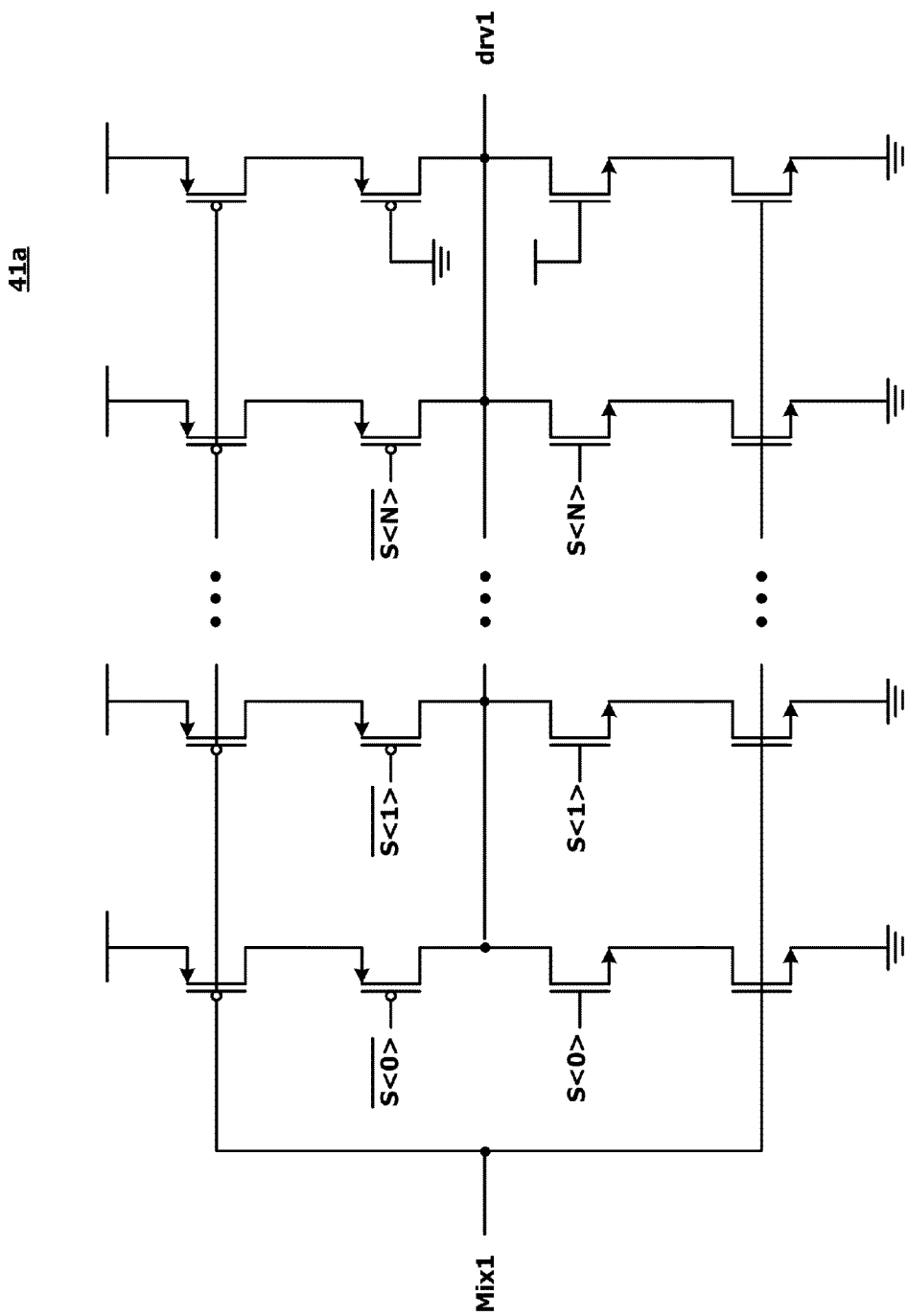
FIG. 16 illustrates a detailed circuit diagram of a weighted inverter in FIG. 14, according to an embodiment of the present invention.

FIG. 16 is a detailed circuit diagram of a weighted inverter 41a shown in FIG. 14, in accordance with an embodiment of the present invention. A representative example of the weighted inverter may include an inverting logic circuit of which a driving strength is controlled by a control code. Referring to FIG. 16, since the number of transistors to be turned on varies by the thermometer control code (S<0:N>, '1'), a driving strength of the output signal drv1 also varies accordingly. In other words, a weight is given to the output clock signal Mix1 of the third coarse delay circuit 430 according to the thermometer control code (S<0:N>, '1'), thereby driving the intermediate clock signal drv1. The other weighted inverters operate in the same manner.

Figure 17:
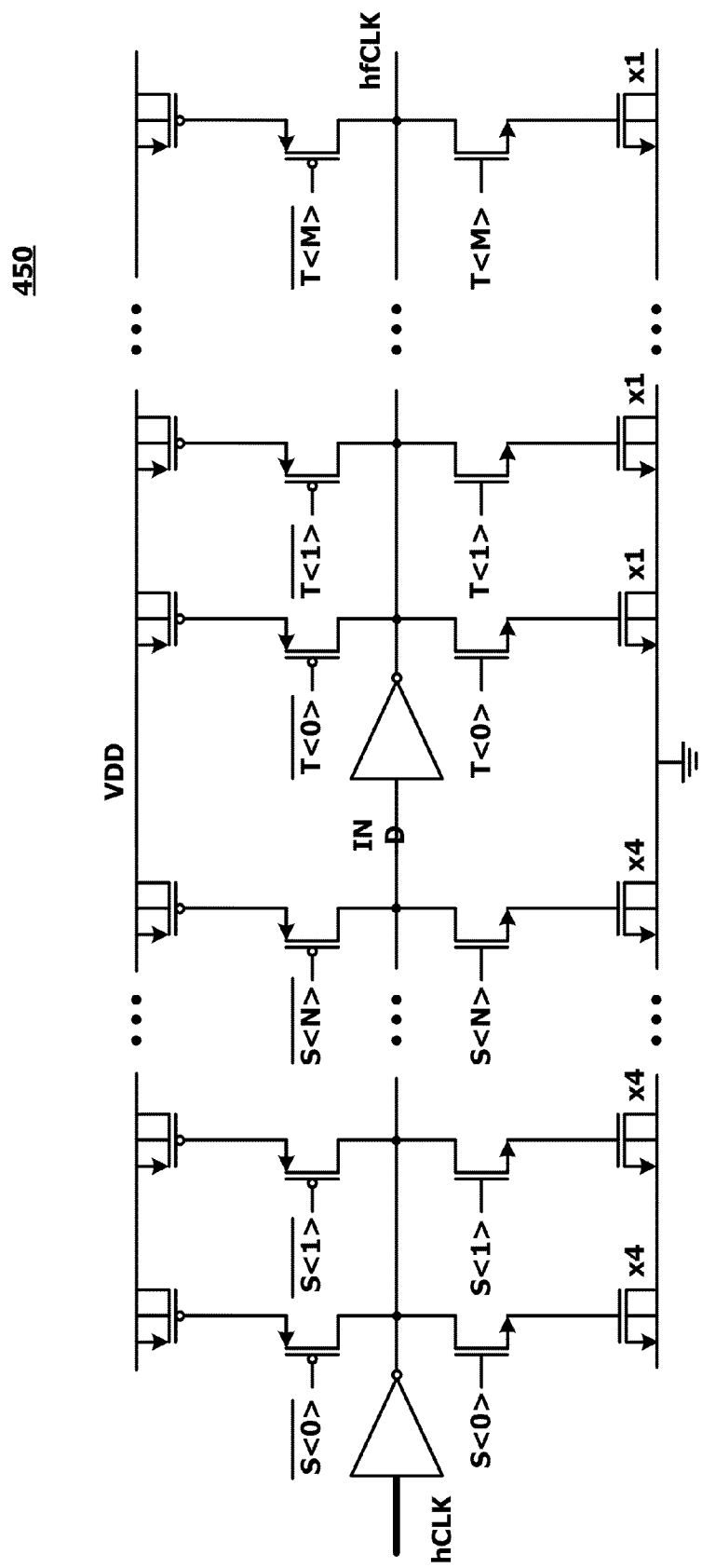
FIG. 17 is a detailed circuit diagram of a duty cycle fine tuning circuit illustrated in FIG. 7, according to an embodiment of the present invention.

FIG. 17 is a detailed circuit diagram of the duty cycle fine tuning circuit 450 shown in FIG. 7, in accordance with an embodiment of the present invention. The duty cycle fine tuning circuit 450 performs a tuning operation through two stages according to two thermometer control codes S<0:N> and T<0:M>. The two thermometer control codes have been represented by "DCC_FT" in FIG. 7. When the two thermometer control codes S<0:N> and T<0:M> are '0000 . . . 0', a signal passing through the duty cycle fine tuning circuit 450 is not influenced by junction capacitance between NMOS and PMOS transistors, but delayed to the minimum extent. When the two thermometer control codes S<0:N> and T<0:M> are '1111 . . . 1', the signal is influenced by junction capacitance between NMOS and PMOS transistors, and thus delayed to the maximum extent.

Figure 18:
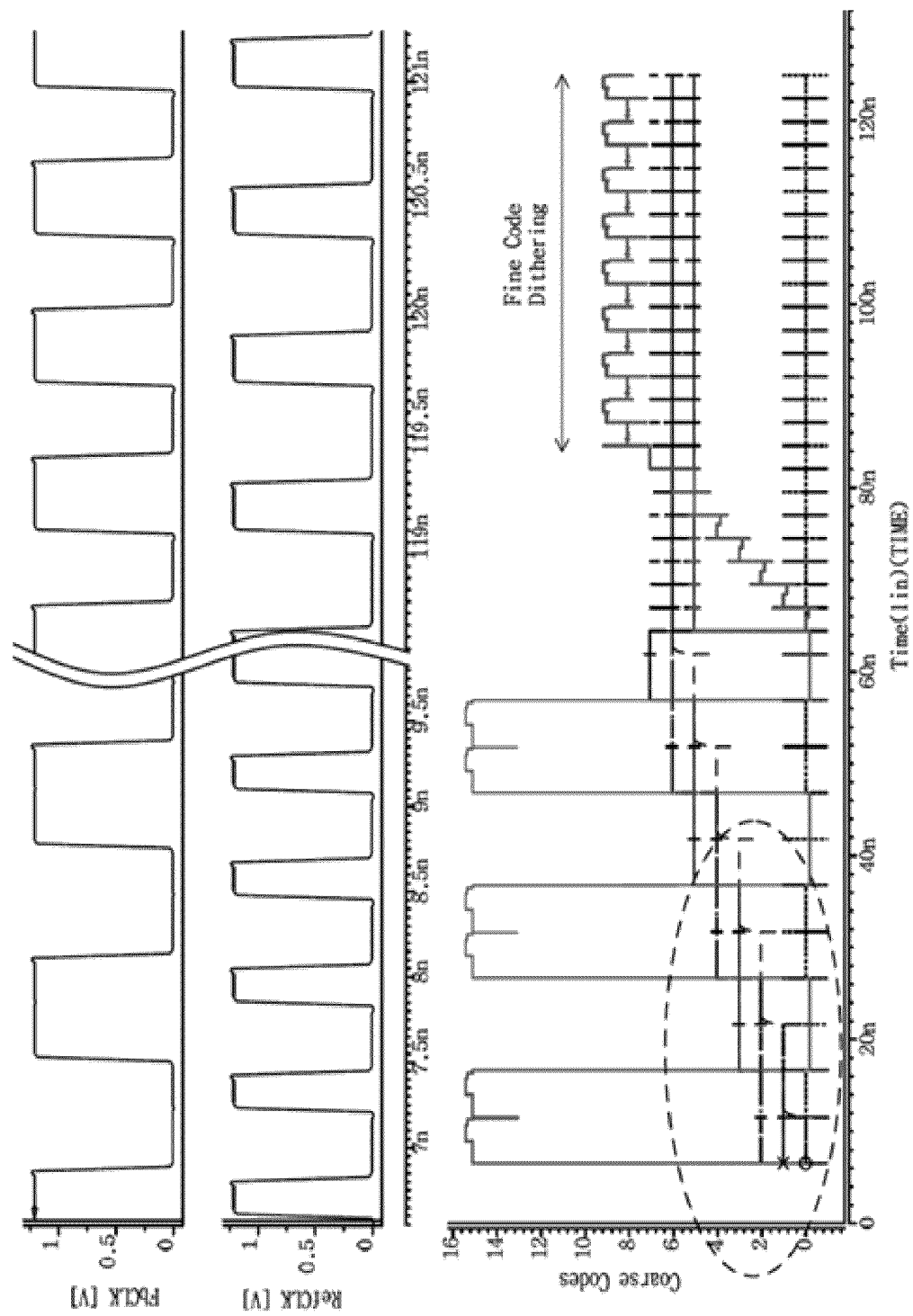
FIG. 18 shows a waveform diagram illustrating that an output clock signal FbCLK of a DLL is delayed by one period with respect to an external clock signal RefCLK and synchronized with the external clock signal RefCLK, and a graph illustrating results obtained by simulating control code changes, according to an embodiment of the present invention.

FIG. 18 shows a waveform diagram illustrating that the output clock signal FbCLK of the DLL is delayed by one period with respect to the external clock signal RefCLK and synchronized with the external clock signal RefCLK, in accordance with an embodiment of the present invention. FIG. 18 further shows a graph illustrating results obtained by simulating control code changes. During the coarse lock operation, the control codes of the first coarse delay circuit 410 and the third or fourth coarse delay circuit 430 or 440 alternately increase (refer to a dotted circle). In this case, the control code of the second coarse delay circuit 420 is '0'. This section corresponds to a section in which a value of the coarse control code CD2 is maintained at '0' in FIG. 19. This is because the coarse lock is achieved before the delay times of the third and fourth coarse delay circuits 430 and 440 increase by the half of the delay circuit length to perform the seamless boundary switching method. After the coarse lock is achieved, the fine code is changed. Finally, when the DLL is locked, the fine code enters a dithering state in which one bit thereof repetitively rises and falls.

Figure 19:
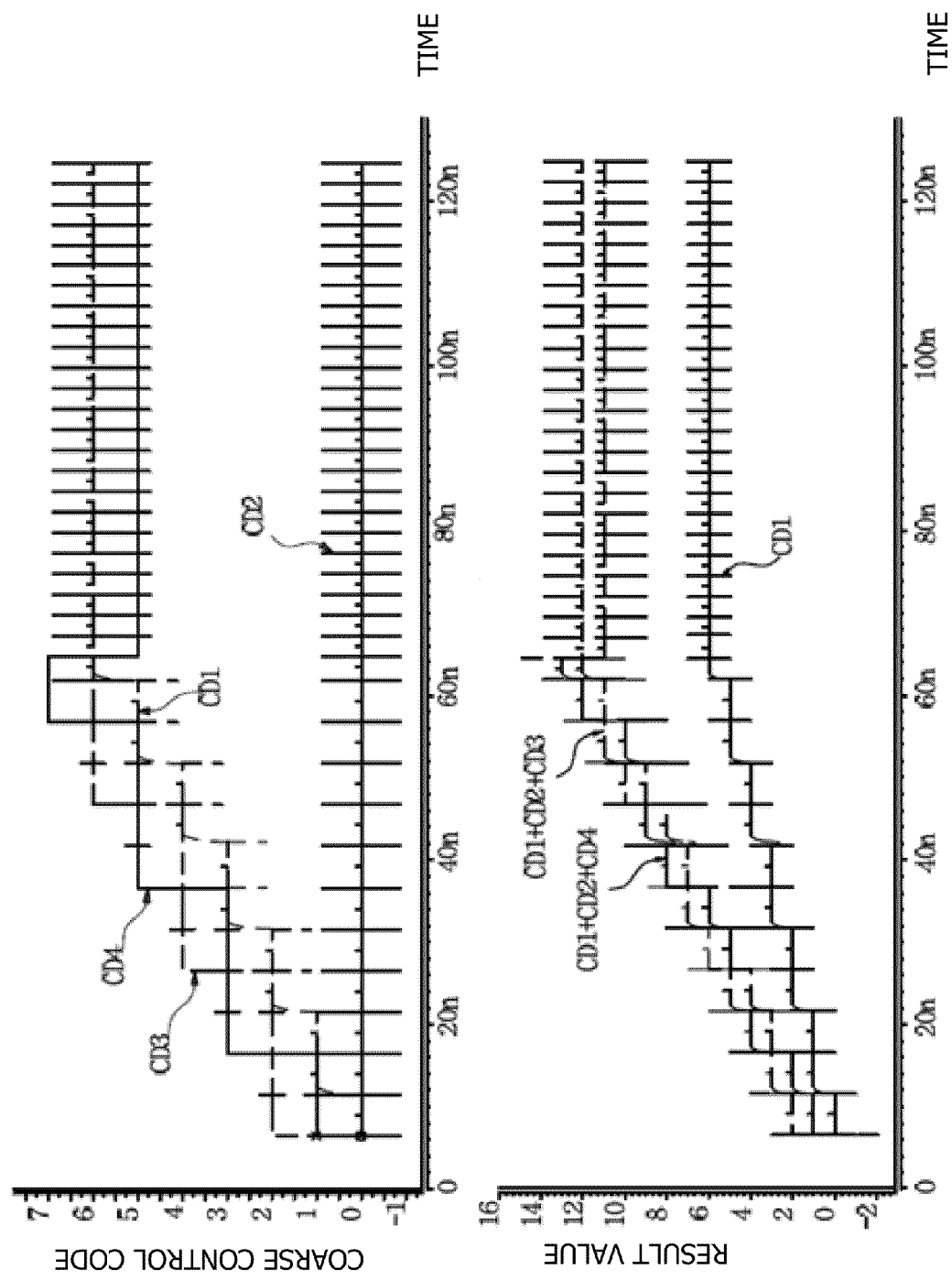
FIG. 19 is a graph illustrating results obtained by simulating the sum of control codes of first, second, and third coarse delay circuits, the sum of control codes of first, second, and fourth coarse delay circuits, and a control code of the first coarse delay circuit in a delay circuit illustrated in FIG. 3, according to an embodiment of the present invention.

FIG. 19 is a graph illustrating results obtained by simulating the sum (Mix1: CD1+CD2+CD3) of the control codes of the first, second, and third coarse delay circuits, the sum (Mix2: CD1+CD2+CD4) of the control codes of the first, second, and fourth coarse delay circuits, and the value (hfCLK: CD1) of the control code of the first coarse delay circuit, in accordance with an embodiment of the present invention. This corresponds to a result obtained by simulating the waveform diagram of FIG. 13. As described above, it can be seen that the half clock signal hfCLK increases the delay time of the delay circuit while maintaining the half delay time of the delay circuit 400 during the coarse lock operation.

According to the embodiment of the present invention, as the duty cycle corrector is embedded in the DLL, the replica delay circuit included in the conventional DLL may be removed, which makes it possible to reduce the power consumption and chip area.

Furthermore, since the duty cycle corrector is positioned just before the delay circuits inside the DLL, ranges of the operating frequency and the duty cycle of the clock signal inputted to the DLL may be maximized.

Furthermore, since the duty cycle corrector is positioned in a feedback path inside the DLL, the correction result is reflected into the DLL to compare and detect phases and duty cycles of the input and output clock signals of the DLL. Therefore, the DLL operation may be performed more efficiently.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A delayed locked loop (DLL) that adjusts a duty cycle of an input clock signal and outputs an output clock signal, comprising:
   a phase and duty cycle detector configured to detect phases and duty cycles of the input and output clock signals;
   a duty cycle corrector configured to correct the duty cycle of the input clock signal based on a half clock signal;
   a control code generator configured to detect coarse lock of the DLL and generate a coarse lock signal and control codes; and
   a delay circuit configured to delay an output signal of the duty cycle corrector by a predetermined time, perform a phase mixing operation on the delayed signal, and generate the half clock signal for tuning the duty cycle of the output clock signal, in response to the control codes.

2. The DLL of claim 1, wherein the duty cycle corrector is configured to output a clock signal having substantially the same frequency as the input clock signal and a duty cycle of about 50%.

3. The DLL of claim 1, wherein the duty cycle corrector comprises:
   a divide-by-two circuit configured to output a divided-by-two signal based on the input clock signal, the divided-by-two signal having a period twice longer than a period of the input clock signal;
   an edge coupler configured to output a signal responding to one or more of rising and falling edges of the input clock signal based on the half clock signal; and
   a multiplexer (MUX) configured to select and output one of an output of the divide-by-two circuit and an output of the edge coupler in response to the coarse lock signal from the control code generator.

4. The DLL of claim 1, wherein the half clock signal is generated to have substantially the same frequency as the input clock signal and a period delayed by one-half of a period of the input clock signal.

5. The DLL of claim 3, wherein while the coarse lock is not achieved at an initial stage in which the DLL starts to operate, the divide-by-two circuit outputs the divided-by-two signal, and the divided-by-two signal has a duty cycle of about 50%.

6. The DLL of claim 3, wherein while the coarse lock is not achieved at an initial stage where the DLL starts to operate, the divide-by-two circuit operates in such a manner that a changing edge of the output clock signal coincides with a changing edge of the divided-by-two signal output from the divide-by-two circuit, and then the coarse lock is achieved as a result of an operation of the divide-by-two circuit.

7. The DLL of claim 6, wherein after the coarse lock is achieved, the DLL operates in such a manner that the changing edge of the output clock signal coincides with a changing edge of the input clock signal.

8. The DLL of claim 1, wherein the control code generator comprises:
   a coarse lock detector configured to detect the coarse lock and generate the coarse clock signal;
   a delay code generator configured to generate delay control codes in response to delay information of the input clock signal; and
   a phase code generator configured to generate a phase control code in response to phase information of the input clock signal,
   wherein the control codes include the delay control codes and the phase control code.

9. The DLL of claim 1, wherein the delay circuit comprises:
   a plurality of coarse delay circuits configured to control a delay amount of the output signal of the duty cycle corrector in response to delay control codes outputted from the control code generator;
   a phase mixer circuit configured to mix phases of clock signals outputted from the plurality of coarse delay circuits in response to delay control codes outputted from the control code generator; and
   a duty cycle fine tuning circuit configured to control a duty cycle of the half clock signal in response to a phase control code outputted from the control code generator, wherein the control codes include the delay control codes and the phase control code.

10. The DLL of claim 9, wherein the phase mixer circuit is configured to adjust a delay-time resolution of the output clock signal by performing the phase mixing operation divided into two stages in response to the delay control codes outputted from the control code generator.

11. The DLL of claim 10, wherein the phase mixing operation is performed by an inverting logic circuit, and a driving strength of the inverting logic circuit is controlled by the delay control codes outputted from the control code generator.

12. The DLL of claim 9, wherein the duty cycle fine tuning circuit is configured to control a delay-time resolution of the half clock signal in response to the phase control code outputted from the control code generator.

13. The DLL of claim 12, wherein the duty cycle fine tuning circuit comprises an inverting logic circuit in which the delay-time resolution of the half clock signal is controlled by adjusting a driving strength of the inverting logic circuit in response to the phase control code.

14. The DLL of claim 9, wherein the plurality of coarse delay circuits includes first to fourth coarse delay circuits,
wherein the first coarse delay circuit is configured to receive the output signal of the duty cycle corrector and provide its output signal to the second coarse delay circuit and the duty cycle fine tuning circuit,
wherein the second coarse delay circuit is configured to provide its output signal to the third and fourth coarse delay circuit in parallel, and
wherein each of the third and fourth coarse delay circuit is configured to provide its output signal to the phase mixer circuit.

15. The DLL of claim 14, wherein a delay time of the first coarse delay circuit is adjusted to be about one-half of a delay time of the delay circuit.

16. The DLL of claim 14, wherein a delay time of the second coarse delay circuit is determined after delay times of the third and fourth coarse delay circuits are determined.

17. The DLL of claim 14, wherein each of the first and second coarse delay circuits includes a first number of coarse delay units (CDUs) coupled in series, and
wherein each of the third and fourth coarse delay circuits includes a second number of CDUs coupled in series, the second number being a predetermined time smaller than the first number.

18. The DLL of claim 9, wherein the phase mixer circuit is configured to perform a seamless boundary switching method between a find delay and a coarse delay according to the increase of a code value by selectively giving a weight to the clock signals outputted from the plurality of coarse delay circuits.

* * * * *